United States Patent

Tokuhisa et al.

[11] Patent Number: 5,916,688
[45] Date of Patent: Jun. 29, 1999

[54] RESIN SOLUTION COMPOSITIONS FOR ELECTRONIC MATERIALS AND PROTECTIVE MEMBRANES PREPARED THEREFROM FOR CIRCUITS IN PRINTED WIRING BOARDS

[75] Inventors: Kiwamu Tokuhisa, Kimitsu; Akira Tokumitsu, Kisarazu; Isamu Takarabe, Kimitsu, all of Japan

[73] Assignee: Nippon Steel Chemical Co., Ltd., Tokyo, Japan

[21] Appl. No.: 09/025,629

[22] Filed: Feb. 18, 1998

[30] Foreign Application Priority Data

Feb. 18, 1997 [JP] Japan .................................. 9-033714

[51] Int. Cl.⁶ ............................ C08F 283/04; B32B 9/04
[52] U.S. Cl. ......................... 428/447; 525/423; 525/476; 525/422; 428/446; 428/413; 428/473.5
[58] Field of Search ..................... 525/423, 476, 525/422; 428/447, 446, 413, 473.5

[56] References Cited

U.S. PATENT DOCUMENTS

| | | | |
|---|---|---|---|
| 5,252,703 | 10/1993 | Nakajima et al. | 525/423 |
| 5,510,425 | 4/1996 | Matsuura et al. | 525/423 |
| 5,643,986 | 7/1997 | Ishikawa et al. | 524/366 |
| 5,677,383 | 10/1997 | Ohmori et al. | 525/423 |

FOREIGN PATENT DOCUMENTS

| | | |
|---|---|---|
| 57-143328 | 9/1982 | Japan . |
| 58-13631 | 1/1983 | Japan . |
| 62-242393 | 10/1987 | Japan . |

*Primary Examiner*—Robert Dawson
*Assistant Examiner*—Caixia Lu-Rutt
*Attorney, Agent, or Firm*—Birch, Stewart, Kolasch & Birch, LLP

[57] ABSTRACT

This invention relates to resin solution compositions for electronic materials consisting of organic solutions of 100 parts by weight of siloxanepolyimidepolyamic acid copolymers composed of imide segments formed by polycondensation of aromatic tetracarboxylic acid dianhydrides and siloxanediamines and amic acid segments formed by polyaddition of aromatic tetracarboxylic acid dianhydrides and aromatic diamines other than siloxanediamines and represented by the following general formula (1)

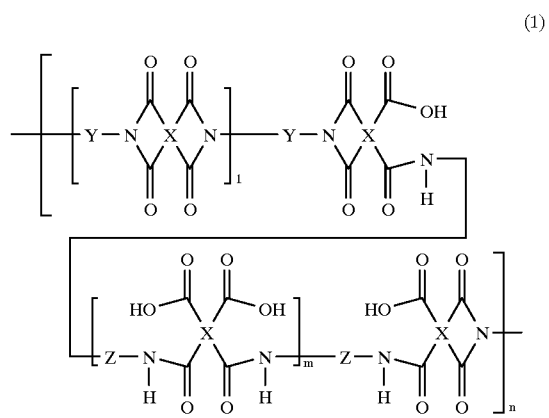

(in which X is the residue of an aromatic tetracarboxylic acid dianhydride, Y is the residue of a siloxanediamine, Z is the residue of an aromatic diamine, l and m are integers independent of each other, and n is an integer of 1 or more) and 1 to 50 parts by weight of epoxy resins. The compositions are storage-stable and curable at relatively low temperature and yield cured products with an excellent balance of heat resistance, high-frequency characteristics, chemical resistance and stress relaxation characteristics.

5 Claims, No Drawings

RESIN SOLUTION COMPOSITIONS FOR ELECTRONIC MATERIALS AND PROTECTIVE MEMBRANES PREPARED THEREFROM FOR CIRCUITS IN PRINTED WIRING BOARDS

FIELD OF THE INVENTION AND RELATED ART STATEMENT

This invention relates to resin solution compositions for electronic materials useful for interlayer insulation membranes and surface protection membranes for wiring elements in printed wiring boards, die-bonding agents for semiconductor packaging, liquid encapsulants, heat-resistant adhesives for electronic materials and others and also relates to protective membranes prepared from said resin solution compositions for circuits in printed wiring boards.

Various proposals have been made on the use of varnishes based on aromatic polyimides or aromatic polyimide precursors (aromatic polyamic acids) for electrically insulating protective membranes (such as interlayer insulation membranes), for example, in Japan Kokai Tokkyo Koho No. Sho 62-242393 (1987). In this case, on account of the insolubility of aromatic polyimides in nearly all organic solvents, varnishes of polyamic acids which are precursors of polyimides and show somewhat improved solvent solubility are often used instead. After application to a base board and stripping of the solvent, however, polyamic acid varnishes need to be cured at a high temperature of 250° C. or more for a long period of time in order to complete the final imidation reaction and this has caused problems in respect to curing equipment, workability and productivity. Furthermore, with the use of polyamic acid varnishes for protective membranes in printed wiring boards, a heat treatment at high temperature produces an oxide membrane on the surface of a copper foil circuit and causes reliability problems.

On the other hand, the properties of resins as coatings impose a restriction on the concentration of resins in organic solvents even for aromatic polyamic acid varnishes whose solvent solubility has been improved by introduction of such chemical structures as ether, sulfone and ketone into the backbone and the varnishes in question can be applied at a resin concentration of 20% or so at most. In consequence, there was a problem of one-time application of varnishes being unable to produce a coat of sufficient thickness in the cases where there is a need for a thick coat.

As a means to solve the aforementioned problems of curing temperature and solvent solubility, polyimides and polyamic acids containing copolymerized siloxanediamines in their backbones have been proposed [Japan Kokai Tokkyo Koho No. Sho 57-143328 (1982) and Japan Kokai Tokkyo Koho No. Sho 58-13631 (1983)]. However, an attempt made here to improve curing temperature and solvent solubility by controlling the proportion of copolymerized siloxanediamines has conversely caused a problem of lowered solvent resistance.

In particular, siloxanepolyimides containing a high proportion of siloxanediamines show low solvent resistance not only to amides such as N,N-dimethylacetamide and N-methyl-2-pyrrolidone and glymes such as diethyleneglycol dimethylether (diglyme) but also to common ketones such as acetone and methyl ethyl ketone and they suffer from a disadvantage of restricted use.

Moreover, polyamic acid varnishes prepared from common siloxanediamines with terminal aminoalkyl groups tend to hydrolyze easily by absorption of moisture and have presented a problem of decreases in viscosity during storage.

OBJECT AND SUMMARY OF THE INVENTION

The present inventors have conducted studies on the aforementioned problems, found that resin solution compositions consisting of homogeneous solutions in organic solvents of a mixture of polyimidepolyamic acid copolymers composed of imide segments derived from aromatic tetracarboxylic acid dianhydrides and siloxanediamines and amic acid segments derived from aromatic tetracarboxylic acid dianhydrides and aromatic diamines and epoxy resins can solve the aforementioned problems and completed this invention.

Accordingly, it is an object of this invention to provide resin solution compositions for electronic materials which are storage-stable and curable at relatively low temperature and yield cured products with an excellent balance of heat resistance, high-frequency characteristics, chemical resistance and stress relaxation characteristics and to provide protective membranes for circuits in printed wiring boards with the use of said compositions.

Thus, this invention relates to resin solution compositions for electronic materials consisting of solutions in organic solvents of 100 parts by weight of siloxanepolyimide-polyamic acid copolymers composed of imide segments formed by polycondensation of aromatic tetracarboxylic acid dianhydrides and siloxanediamines and amic acid segments formed by polyaddition of aromatic tetracarboxylic acid dianhydrides and aromatic diamines other than siloxanediamines and represented by the following general formula (1)

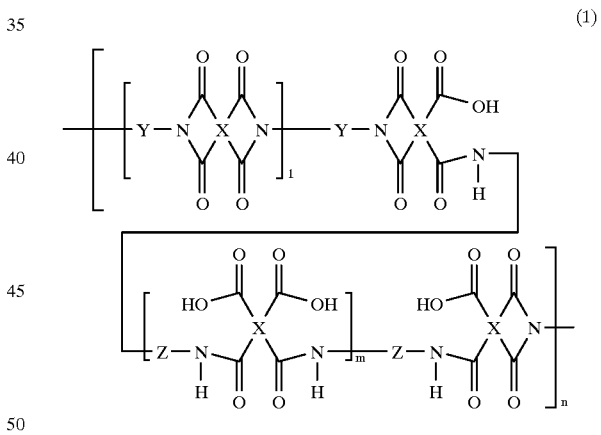

(1)

(wherein X is the residue of an aromatic tetracarboxylic acid dianhydride, Y is the residue of a siloxanediamine, Z is the residue of an aromatic diamine, l and m are integers independent of each other and n is a number equal to 1 or more) and 1 to 50 parts by weight of epoxy resins.

This invention also relates to protective membranes prepared from such resin solution compositions for circuits in printed wiring boards.

This invention will be described in detail below.

Aromatic tetracarboxylic acid dianhydrides to be used in this invention refer to compounds in which carboxylic groups are linked to aromatic compounds. Examples of such aromatic tetracarboxylic acid dianhydrides are pyromellitic dianhydride, 3,3',4,4'-benzophenonetetracarboxylic acid dianhydride, 2,2',3,3'-benzophenonetetracarboxylic acid dianhydride, 2,3,3',4'-benzophenonetetracarboxylic acid dianhydride, naphthalene-2,3,6,7-tetracarboxylic acid dianhydride, naphthalene-1,2,5,6-tetracarboxylic acid dianhydride, naphthalene-1,2,4,5-tetracarboxylic acid dianhydride, naphthalene-1,4,5,8-tetracarboxylic acid dianhydride, naphthalene-1,2,6,7-tetracarboxylic acid dianhydride, 2,6-dichloronaphthalene-1,4,5,8-tetracarboxylic acid dianhydride, 2,7-dichloronaphthalene-1,4,5,8-tetracarboxylic acid dianhydride, 2,3,6,7-tetrachloronaphthalene-1,4,5,8-tetracarboxylic acid dianhydride, 1,4,5,8-tetrachloronaphthalene-2,3,6,7-tetracarboxylic acid dianhydride, 3,3',4,4'-biphenyltetracarboxylic acid dianhydride, 2,2',3,3'-biphenyltetracarboxylic acid dianhydride, 2,3,3',4'-biphenyltetracarboxylic acid dianhydride, 3,3'',4,4''-p-terphenyltetracarboxylic acid dianhydride, 2,2'',3,3''-p-terphenyltetracarboxylic acid dianhydride, 2,3,3'',4''-p-terphenyltetracarboxylic acid dianhydride, 2,2-bis(2,3-dicarboxyphenyl)propane dianhydride, 2,2-bis(3,4-dicarboxyphenyl)propane dianhydride, bis(2,3-dicarboxyphenyl) ether dianhydride, bis(2,-dicarboxyphenyl)methane dianhydride, bis(3,4-dicarboxylphenyl)methane dianhydride, bis(2,3-dicarboxyphenyl) sulfone dianhydride, bis(3,4-dicarboxyphenyl) sulfone dianhydride, 1,1-bis(2,3-dicarboxyphenyl)ethane dianhydride, 1,1-bis(3,4-dicarboxyphenyl)ethane dianhydride, perylene-2,3,8,9-tetracarboxylic acid dianhydride, perylene-3,4,9,10-tetracarboxylic acid dianhydride, perylene-4,5,10,11-tetracarboxylic acid dianhydride, perylene-5,6,11,12-tetracarboxylic acid dianhydride, phenanthrene-1,2,7,8-tetracarboxylic acid dianhydride, phenanthrene-1,2,6,7-tetracarboxylic acid dianhydride, phenanthrene-1,2,9,10-tetracarboxylic acid dianhydride, pyrazine-2,3,5,6-tetracarboxylic acid dianhydride, thiophene-2,3,4,5-tetracarboxylic acid dianhydride and 4,4'-oxydiphthalic acid dianhydride. Any of these compounds may be used alone or two kinds or more of them may be used together. Particularly useful among them is bis(3,4-dicarboxyphenyl) sulfone dianhydride as this compound helps siloxanepolyimidepolyamic acid copolymers to exhibit good solubility in organic solvents and develop strong adhesion to copper.

As for diamines to be used together with aromatic tetracarboxylic acid dianhydrides to form siloxanepolyimidepolyamic acid copolymers in this invention, siloxanediamines are used to form imide segments and aromatic diamines to form amic acid segments.

Siloxanediamines useful for this invention are preferably represented by the following general formula (2)

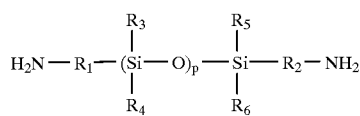

(wherein $R_1$ and $R_2$ are divalent hydrocarbon groups, $R_3$ to $R_6$ are respectively hydrocarbon groups with 1 to 6 carbon atoms and p is an integer from 1 to 30).

In the aforementioned general formula (2), it is preferable that $R_1$ and $R_2$ are respectively plural methylene groups with 3 to 5 carbon atoms or phenylene group, $R_3$ to $R_6$ are methyl, ethyle, propyl or phenyl group, and p which is the average of repeating units is an integer from 1 to 20.

In particular, the average of repeating units (p) in siloxanediamines represented by the general formula (2) is preferably 1 to 12 in the cases where resin solution compositions of this invention are used for protective membranes on circuits in printed wiring boards and siloxanediamines with p in excess of 12 lower the adhesive strength of siloxanepolyimidepolyamic acid copolymers to copper and polyimides.

Concrete examples of siloxanediamines are ω, ω'-bis(2-aminoethyl) polydimethylsiloxane, ω, ω'-bis(3-aminopropyl)polydimethylsiloxane, ω, ω'-bis(4-aminophenyl)polydimethylsiloxane, ω, ω'-bis(3-aminopropyl) polydiphenylsiloxane and ω, ω'-bis(3-aminopropyl)polymethylphenylsiloxane In this invention, the imide segments in siloxanepolyimidepolyamic acid copolymers to be formed by addition of aromatic tetracarboxylic acid dianhydrides and siloxanediamines are preferably substantially stable imides.

Aromatic diamines useful for this invention are those compounds in which amino groups are linked to aromatic compounds. Examples of such aromatic diamines are 3,3'-dimethyl-4,4'-diaminobiphenyl, 4,6-dimethyl-m-phenylenediamine, 2,5-dimethyl-p-phenylenediamine, 2,4-diaminomesitylene, 4,4'-methylene-di-o-toluidine,4,4'-methylene-di-2,6-xylidine, 2,4-toluenediamine, m-phenylenediamine, p-phenylenediamine, 4,4'-diaminodiphenylpropane, 3,3'-diaminodiphenylpropane, 4,4'-diaminodiphenylethane, 3,3'-diaminodiphenylethane, 4,4'-diaminodiphenylmethane, 3,3'-diaminodiphenylmethane, 2,2-bis[4-(4-aminophenoxy)phenyl]propane, 4,4'-diaminodiphenyl sulfide, 3,3'-diaminodiphenyl sulfide, 4,4'-diaminodiphenyl sulfone, 3,3'-diaminodiphenyl sulfone, 4,4'-diaminodiphenyl ether, 3,3'-diaminodiphenyl ether, benzidine, 3,3'-diaminobiphenyl, 3,3'-dimethyl-4,4'-diaminobiphenyl, 3,3'-dimethoxybenzidine, 4,4'-diamino-p-terphenyl, 3,3'-diamino-p-terphenyl, 1,5-diaminonaphthalene, 2,6-diaminonaphthalene, 2,4-diaminotoluene, m-xylene-2,5-diamine, p-xylene-2,5-diamine and 1,3-bis(3-aminophenoxy)benzene. Any of these aromatic diamines may be used alone or two kinds or more of them may be used together. Particularly suitable among them is 2,2-bis[4-(4-aminophenoxy)phenyl]propane as it yields siloxanepolyimidepolyamic acid copolymers with excellent solubility in organic solvents.

It is possible to control the molecular weight of siloxanepolyimidepolyamic acid copolymers of this invention by adjusting the molar ratio of monomers as in the case of polymers normally prepared by polycondensation. Concretely, it is preferable to use 0.8 to 1.2 moles of diamines for 1 mole of aromatic tetracarboxylic acid anhydrides in whole. A molar ratio of 0.8 or less or of 1.2 or more will give only low-molecular-weight polymers with insufficient heat resistance. More preferably, the molar ratio is 0.95 to 1.05 moles of diamines to 1 mole of aromatic tetracarboxylic acid dianhydrides and, most preferably, it is 0.98 to 1.02 moles to 1 mole.

The molar ratio of siloxanediamines to aromatic diamines is preferably 30/70 to 99/1 or most preferably 50/50 to 99/1. A molar ratio of less than 30/70 adversely affects the solvent solubility and stress relaxation characteristics of siloxanepolyimidepolyamic acid copolymers. On the other hand, a molar ratio in excess of 99/1 reduces the number of reaction points between siloxanepolyimidepolyamic acid copolymers and epoxy resins which results in lowering of the chemical resistance of cured resins.

In particular, when resin solution compositions of this invention are used for protective membranes on circuits in flexible printed wiring boards, the molar ratio of siloxanediamines to aromatic diamines is preferably 70/30 to 99/1. A molar ratio of less than 70/30 adversely affects the stress relaxation characteristics of cured siloxanepolyimidepolyamic acid copolymers, resulting in greater curling of flexible printed wiring boards. On the other hand, a molar ratio in excess of 99/1 reduces the number of reaction points between siloxanepolyimidepolyamic acid copolymers and epoxy resins which results in lowering of the chemical resistance of cured resins.

The logarithmic viscosity, as an index of molecular weight, of siloxanepolyimidepolyamic acid copolymers to be used in this invention is preferably 0.08 to 1.2. The logarithmic viscosity is determined by dissolving siloxanepolyimidepolyamic acid copolymers homogeneously in diglyme to a concentration of 0.5 g/100 ml, measuring the viscosity of the resin solution and the solvent diglyme at 30° C. with the aid of an Ubbellohde viscometer, and using the following equation:

$$\text{logarithmic viscosity} = \{\ln[(\text{viscosity of solution})/(\text{viscosity of solvent})]\}/(\text{concentration of solution})$$

Siloxanepolyimidepolyamic acid copolymers with a logarithmic viscosity of less than 0.08 produce cured resins of poor chemical and heat resistance while those with a logarithmic viscosity of more than 1.2 yield resin solution compositions with viscosity too high for good workability.

Epoxy resins to be mixed with siloxanepolyimidepolyamic acid copolymers in this invention are not specified in any way, but they are desirably liquid or powder with an epoxy equivalent of 100 to 5,000, particularly 100 to 1,000. Concrete examples of such epoxy resins are glycidyl ethers derived from phenols such as bisphenol A, bisphenol F, bisphenol S, fluorenebisphenol, 4,4'-dihydroxybiphenyl, 2,2'-dihydroxybiphenyl, hydroquinone and resorcin, trivalent or higher phenols such as tris(4-hydroxyphenyl)ethane, phenol novolaks and o-cresol novolaks and halogenated bisphenols such as tetrabromobisphenol A and bromophenol novolaks, any of these compounds may be used alone or two kinds or more of them may be used together. It is preferable to use bifunctional bisphenol-based epoxy resins with a relatively high epoxy equivalent in order to obtain resin solution compositions of good stability and produce cured products of low modulus and good stress relaxation characteristics.

It is necessary to mix 1 to 50 parts by weight, preferably 3 to 30 parts by weight, of epoxy resins with 100 parts by weight of siloxanepolyimidepoly amic acid copolymers. An addition of epoxy resins in excess of 50 parts by weight lowers the stress relaxation characteristics and heat resistance of cured resins while an addition of less than 1 part by weight decreases the chemical resistance.

According to this invention, it is allowable to add, as needed, epoxy resin curing agents to the aforementioned siloxanepolyimidepolyamic acid copolymers and epoxy resins for the purpose of accelerating curing.

Organic solvents to be used in this invention are not specified in any way and those solvents which dissolve the resin compositions in question homogeneously can be used satisfactorily, either singly or as a mixture of two kinds or more. Examples are phenols, amides such as pyrrolidone and acetamide, oxanes such as dioxane and trioxane, ketones such as cyclohexanone and glymes such as diglyme and triethyleneglycol dimethylether (triglyme). If necessary, it is possible to add aromatic hydrocarbons such as benzene and toluene and aliphatic hydrocarbons such as hexane and decane to the extent that a homogeneous solution results.

These organic solvents are added in such an amount as to make the ratio by weight of the sum as solid of siloxanepolyimidepolyamic acid copolymers and epoxy resins to the solvents (20~80)/(80~20), preferably (40~70)/(60~30). A ratio in excess of 80 makes it difficult to obtain cured products with a sufficient thickness while a ratio less than 20 raises the viscosity of resin solution compositions too high to work with comfortably.

Resin solution compositions of this invention can be prepared in the following manner.

Aromatic tetracarboxylic acid dianhydrides taken in excess and are dissolved or suspended in an organic solvent and the siloxanediamines are added slowly. The mixture is stirred at a temperature in the vicinity of room temperature for 2 to 3 hours and then heated at a temperature favoring imidation for 10 to 24 hours with removal of water of condensation to effect polymerization and imidation and give siloxanepolyimide oligomers containing terminal acid anhydride. The imidation is normally effected in the range from 150 to 300° C. The degree of imidation (%) of the siloxanepolyimide oligomers as determined by infrared absorption spectrometry is desirably substantially 100% free of amic acid segments. Thereafter, the reaction mixture is cooled to the vicinity of room temperature, aromatic diamines are added in such an amount as to produce a roughly equimolar mixture of the acid anhydrides and the whole amines, and the reaction is allowed to proceed at a temperature inactive to imidation to give a solution of siloxanepolyimidepolyamic acid copolymers. Epoxy resins are then dissolved homogeneously in the solution of siloxanepolyimide polyamic acid copolymers to give a resin solution composition of this invention.

Organic solvents to be used here are not specified and any of the aforementioned organic polar solvents may be used. However, organic polar solvents with a boiling point of 150° C. or more, preferably 200° C. or more, for example, triglyme, are preferable for reduction of the reaction time and prevention of solvent scattering.

Resin solution compositions of this invention may be formulated from the aforementioned components and additionally, as needed, from known curing accelerators, coupling agents, fillers, pigments, thixotropic agents, and antifoaming agents.

Resin solution compositions of this invention for electronic materials are storage-stable and curable at a low temperature below 180° C. and, when cured, give products with excellent heat resistance, high-frequency characteristics, chemical resistance and stress relaxation characteristics. In consequence, the compositions in question are used advantageously for interlayer insulation membranes and surface protective membranes for parts of printed wiring boards, die-bonding agents for semiconductor packaging, liquid encapsulants, and heat-resistant adhesives for electronic materials.

DETAILED DESCRIPTION OF THE PREFERRED EMBODIMENTS

This invention will be described in detail below with reference to the accompanying examples. The properties of resin solution compositions were evaluated for the test items according to the test methods described below.

[Heat resistance in solder bath]

A resin solution composition of a specified formulation is cast on the roughened surface of a 18 $\mu$m-thick copper foil (0.5 ounce rolled foil manufactured by Mitsui Metal Corporation) to a post-heat-treatment thickness of 15 to 20 $\mu$m, dried preliminarily at 130° C. for 15 minutes and then subjected to heat treatment at 180° C. for 30 minutes to form a film of coating. A coated foil measuring 1 cm×2 cm is immersed in a solder bath controlled at 300° C. for 60 seconds and the results are indicated as follows: ○ no peeling of the film from the surface of copper or no change in appearance of the film; X peeling or a change in appearance of the film.

[Young's Modulus]

A resin solution composition of a specified formulation is cast on a 35 μm-thick copper foil (1 ounce rolled foil manufactured by Mitsui Metal Corporation) to a post-heat-treatment thickness of 15 to 20 μm, dried preliminarily at 130° C. for 15 minutes and then subjected to heat treatment at 180° C. for 30 minutes to form a film of coating. The coated copper foil is treated with an etchant to remove the copper completely, a test specimen of the film measuring 12.5 cm×20 cm is prepared, the specimen is mounted on a tensile tester (STROGRAPH-RI, Toyo Seiki K.K.) and the modulus is determined at a test speed of 5 mm/min under a load of 100 kg.

[Logarithmic viscosity]

The logarithmic viscosity as an index of the molecular weight of siloxanepolyimidepolyamic acid copolymers is determined by dissolving the copolymers homogeneously in diglyme to a concentration of 0.5 g/100 ml, measuring the viscosity of the resin solution and the solvent diglyme at 30° C. with the aid of an Ubbellohde viscometer, and using the following equation:

$$\text{logarithmic viscosity} = \{\ln[(\text{viscosity of solution})/(\text{viscosity of solvent})]\}/(\text{concentration of solution})$$

[Viscosity of solution]

The viscosity of a resin solution composition of a specified formulation is determined at 25° C. with the aid of a Brookfield viscometer.

[Acetone-soluble matters]

A resin solution composition of a specified formulation is cast on a 35 μm-thick copper foil (1 ounce rolled foil manufactured by Mitsui Metal Corporation) to a post-heat-treatment thickness of 15 to 20 μm, dried preliminarily at 130° C. for 15 minutes and then subjected to heat treatment at 180° C. for 30 minutes to form a film of coating. The coated copper foil is treated with an etchant to remove the copper completely, a test specimen of the film measuring 10 cm×10 cm is prepared, the specimen is immersed in acetone at 25° C. for 30 minutes and a loss in weight of the film is taken as acetone-soluble matters.

[Dielectric constant]

A resin solution composition of a specified formulation is cast on the roughened surface of a 35 μm-thick copper foil (1 ounce rolled foil manufactured by Mitsui Metal Corporation) to a post-heat-treatment thickness of 40 to 50 μm, dried preliminarily at 130° C. for 15 minutes and then subjected to heat treatment at 180° C. for 30 minutes to form a film of coating. Another copper foil, from the same stock as the foregoing, is placed on the film of coating with the roughened surface facing the film and pressed at 200° C. and 40 kgf/cm² for 1 hour to form a dobule-sided copper-clad laminate. A circuit is fabricated on the laminate in the manner specified by IPC-TM650.2.5.5A to form a test specimen for measurement of the dielectric constant, the specimen is mounted on an impedance analyzer and the dielectric constant was determined at 1 Mhz.

[Properties of protective membranes]

A wiring part [Flexible Printed Circuit (FPC)] is prepared by fabricating a circuit on an adhesive-free copper-clad laminate (Espanex SC18-40-00ME, tradename of Nippon Steel Chemical Co., Ltd.) in accordance with JIS-C5016 and a resin solution composition of a specified formulation is cast on the FPC to a post-heat-treatment thickness of 20 μm, dried preliminarily at 130° C. for 15 minutes and then subjected to heat treatment at 180° C. for 30 minutes to form a film of coating.

(1) Curling

The radius of curvature of any warpage is measured for the coated FPC specimen and used to evaluate the degree of curling.

(2) Adhesion

A cross-cut test (peeling by an adhesive tape) is used to evaluate the adhesive strength between the film of coating and the FPC copper foil.

(3) Resistance to IPA (2-propanol)

The coated FPC specimen is immersed in 2-propanol at 25° C. for 5 minutes, pulled out, visually observed for any change in appearance and the results are indicated as follows: ○ no dissolution, or swelling; x dissolution, or swelling.

In Comparative Example 3, the heat treatment in the aforementioned tests for heat resistance in solder bath, modulus, acetone-insoluble matters, dielectric constant and properties of protective membranes was carried out at 80° C. for 5 minutes (preliminary drying), at 160° C. for 2 minutes, at 200° C. for 2 minutes and at 270° C. for 2 minutes.

Manufacturing Example 1

Into a Dean-Shyurark type reactor fitted with a stirrer and a nitrogen inlet tube were introduced 39.6 g (0.110 mol) of bis(3,4-dicarboxyphenyl) sulfone dianhydride and 118 g of triglyme, 71.4 g (p=8, 0.093 mol) of ω, ω'-bis(3-aminopropyl)polydimethylsiloxane was added in drops from a dropping funnel in an atmosphere of nitrogen and the mixture was stirred at room temperature for approximately 2 hours. Thereafter, the reaction solution was heated to 190° C. in an atmosphere of nitrogen and stirred at this temperature for 15 hours with removal of water. The reaction solution was then cooled to room temperature, mixed with 7.1 g (0.017 mol) of 2,2-bis[4-(4-aminophenoxy)phenyl] propane, and stirred at room temperature for approximately 5 hours in an atmosphere of nitrogen to give 51 parts by weight as solid of a solution of siloxanepolyimidepolyamic acid copolymers. The logarithmic viscosity of the copolymers was 0.26 at 30° C. and at a concentration of 0.5 g/100 ml.

Manufacturing Example 2

Into a Dean-Shyurark type reactor fitted with a stirrer and a nitrogen inlet tube were introduced 39.6 g (0.110 mol) of bis(3,4-dicarboxyphenyl) sulfone dianhydride and 120 g of triglyme, 76.3 g (p=8, 0.099 mol) of ω, ω'-bis(3-aminopropyl)polydimethylsiloxane was added in drops from a dropping funnel in an atmosphere of nitrogen and the mixture was stirred at room temperature for approximately 2 hours. Thereafter, the reaction solution was heated to 190° C. in an atmosphere of nitrogen and stirred at this temperature for 15 hours with removal of water. The reaction solution was then cooled to room temperature, mixed with 4.5 g (0.011 mol) of 2,2-bis[4-(4-aminophenoxy)phenyl] propane, and stirred at room temperature for approximately 5 hours in an atmosphere of nitrogen to give 51 parts by weight as solid of a solution of siloxanepolyimidepolyamic acid copolymers. The logarithmic viscosity of the copolymers was 0.23 at 30° C. and at a concentration of 0.5 g/100 ml.

Manufacturing Example 3

Into a reactor fitted with a stirrer and a nitrogen inlet tube were introduced 39.6 g (0.110 mol) of bis(3,4- dicarboxyphenyl) sulfone dianhydride and 118 g of triglyme, 71.4 g (p=8, 0.093 mol) of ω, ω'-bis(3-aminopropyl)polydimethylsiloxane was added in drops from a dropping funnel in an atmosphere of nitrogen and the mixture was stirred at room temperature for approximately 5 hours. Thereafter, 7.1 g (0.07 mol) of 2,2-bis[4-(4-aminophenoxy)phenyl]propane was added to the reaction solution and the mixture was stirred at room temperature for approximately 5 hours in an atmosphere of nitrogen to give 50 parts by weight as solid of a solution of siloxanepolyamic acid copolymers. The logarithmic viscosity of the copolymers was 0.27 at 30° C. and at a concentration of 0.5 g/100 ml.

Manufacturing Example 4

Into a reactor fitted with a stirrer and a nitrogen inlet tube were introduced 39.6 g (0.110 mol) of bis(3,4-dicarboxyphenyl) sulfone dianhydride and 339 g of N-methyl-2-pyrrolidone, 45.2 g (0.110 mol) of 2,2-bis[4-(4-aminophenoxy)phenyl]propane was added in an atmosphere of nitrogen with ice cooling, and the resulting reaction solution was stirred further at room temperature for approximately 5 hours in an atmosphere of nitrogen to give 20 parts by weight as solid of a solution of polyamic acids. The logarithmic viscosity of the polyamic acids was 1.5 at 30° C. and at a concentration of 0.5 g/100 ml.

Example 1

Into a 500-ml reactor were introduced 100 g of the solution of siloxanepolyimidepolyamic acid copolymers prepared in Manufacturing Example 1 and 4.1 g of bisphenol A-based epoxy resins (Epo Tohto YD-011 with epoxy equivalent 476 available from Tohto Kasei Co., Ltd.) and the mixture was stirred at room temperature to give a homogeneous resin solution composition. This resin solution composition was tested for storage stability, modulus, heat resistance in solder bath, acetone-soluble matters, dielectric constant, curling, adhesion and resistance to IPA. The composition retained the original homogeneity and viscosity when left standing at room temperature for 1 week. The viscosity was observed to change scarcely when the composition was left standing at 5° C. or less for 3 months.

Example 2

Into a 500-ml reactor were introduced 100 g of the solution of siloxanepolyimidepolyamic acid copolymers prepared in Manufacturing Example 1 and 8.2 g of bisphenol A-based epoxy resins (Epo Tohto YD-014 with epoxy equivalent 956 available from Tohto Kasei Co., Ltd.) and the mixture was stirred at room temperature to give a homogeneous resin solution composition. This resin solution composition was tested for storage stability, modulus, heat resistance in solder bath, acetone-soluble matters, dielectric constant, curling, adhesion and resistance to IPA. The composition retained the original homogeneity and viscosity when left standing at room temperature for 1 week. The viscosity was observed to change scarcely when the composition was left standing at 5° C. or less for 3 months.

Example 3

Into a 500-ml reactor were introduced 100 g of the solution of siloxanepolyimidepolyamic acid copolymers prepared in Manufacturing Example 2 and 4.1 g of bisphenol A-based epoxy resins (Epo Tohto YD-011 with epoxy equivalent 476 available from Tohto Kasei Co., Ltd.) and the mixture was stirred at room temperature to give a homogeneous resin solution composition. This resin solution composition was tested for storage stability, modulus, heat resistance in solder bath, acetone-soluble matters, dielectric constant, curling, adhesion and resistance to IPA. The composition retained the original homogeneity and viscosity when left standing at room temperature for 1 week. The viscosity was observed to change scarcely when the composition was left standing at 5° C. or less for 3 months.

Example 4

A resin solution composition was prepared as in the aforementioned Example 1 except using 2.0 g of o-cresol novolak type epoxy resins (Epo Tohto YDCN-701P with epoxy equivalent 202 available from Tohto Kasei Co., Ltd.) as epoxy resins. This resin solution composition was tested for storage stability, modulus, heat resistance in solder bath, acetone-soluble matters, dielectric constant, curling, adhesion and resistance to IPA. The composition retained the original homogeneity and viscosity when left standing at room temperature for 1 week. The viscosity was observed to change scarcely when the composition was left standing at 5° C. or less for 3 months.

Comparative Example 1

A resin solution composition was prepared as in Example 1 without the use of epoxy resins and tested for storage stability, modulus, heat resistance in solder bath, acetone-soluble matters, dielectric constant, curling, adhesion and resistance to IPA. The composition showed very poor chemical resistance and dissolved in acetone almost completely.

Comparative Example 2

Into a 500-ml reactor were introduced 100 g of the solution of siloxanepolyamic acid copolymers prepared in Manufacturing Example 3 and 4.1 g of bisphenol A-based epoxy resins (Epo Tohto YD-011 with epoxy equivalent 476 available from Tohto Kasei Co., Ltd.) and the mixture was stirred at room temperature to give a homogeneous resin solution composition. This resin solution composition was tested for storage stability, modulus, heat resistance in solder bath, acetone-soluble matters, dielectric constant, curling, adhesion and resistance to IPA. The composition showed marked reduction in viscosity when left standing at room temperature for 1 week. Also, the viscosity was observed to decrease markedly when the composition was kept at 5° C. or less.

Comparative Example 3

The resin solution composition prepared in Manufacturing Example 4 was tested for storage stability, modulus, heat resistance in solder bath, acetone-soluble matters, dielectric constant, curling, adhesion and resistance to IPA. An FPC specimen coated with this composition showed considerable curling.

Table 1 summarizes the formulation of the resin solution compositions in the aforementioned examples and comparative examples and the results of the tests for storage stability, modulus, heat resistance in solder bath, acetone-soluble matters, dielectric constant and properties of protective membranes. Here, the tests for modulus, acetone-soluble matters and dielectric constant were conducted on the day the resin solution compositions were prepared [0 day] while those for viscosity of solution and heat resistance in solder bath were conducted on the day the compositions were prepared [0 day] and also after storage at 5° C. for 90 days [90 days].

TABLE 1

|  | Example | | | | Comparative example | | |
| --- | --- | --- | --- | --- | --- | --- | --- |
|  | 1 | 2 | 3 | 4 | 1 | 2 | 3 |
| Formulation (parts by weight) | | | | | | | |
| Copolymer solution | 100 | 100 | 100 | 100 | 100 | 100 | 100 |
| YD-011 | 4.1 | 0 | 4.1 | 0 | 0 | 4.1 | 0 |
| YD-014 | 0 | 8.2 | 0 | 0 | 0 | 0 | 0 |
| YDCN-701P | 0 | 0 | 0 | 2.0 | 0 | 0 | 0 |
| Viscosity of solution [0 day] (poise) | 134 | 272 | 96 | 129 | 110 | 162 | 290 |
| Viscosity of solution [90 days] (poise) | 141 | 272 | 100 | 138 | 108 | 40 | 268 |
| Heat resistance in solder bath [0 day] | ◯ | ◯ | ◯ | ◯ | ◯ | ◯ | ◯ |
| Heat resistance in solder bath [90 days] | ◯ | ◯ | ◯ | ◯ | ◯ | X | ◯ |
| Young's Modulus (kgf/mm$^2$) | 38 | 37 | 19 | 40 | 27 | 37 | 310 |
| Acetone-soluble matters (wt %) | 4 | 5 | 6 | 3.5 | soluble | 3 | 0.6 |
| Dielectric constant | 3.2 | 3.2 | 3.2 | 3.1 | 3.2 | 3.2 | 3.6 |
| Curling (mm) | none | none | none | none | none | none | 15 |
| Adhesion (%) | 100 | 100 | 100 | 100 | 100 | 100 | 80 |
| Resistance to IPA | ◯ | ◯ | ◯ | ◯ | X | ◯ | ◯ |

What is claimed is:

1. Resin solution compositions for electronic materials consisting of solutions in organic solvents of 100 parts by weight of siloxanepolyimidepolyamic acid copolymers composed of imide segments formed by polycondensation of aromatic tetracarboxylic acid dianhydrides and siloxanediamines and amic acid segments formed by polyaddition of aromatic tetracarboxylic acid dianhydrides and aromatic diamines other than siloxanediamines and represented by the following general formula (1)

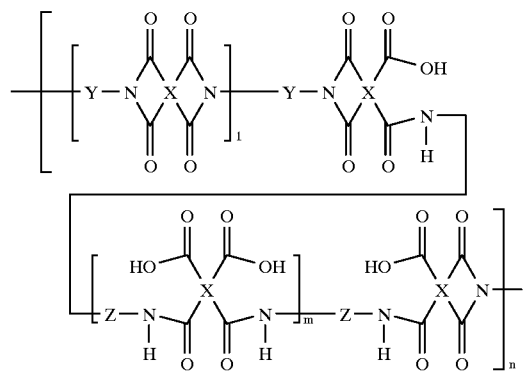

in which X is the residue of an aromatic tetracarboxylic acid dianhydride, Y is the residue of a siloxanediamine, Z is the residue of an aromatic diamine, l and m are integers independent of each other, and n is an integer of 1 or more; and 1 to 50 parts by weight of epoxy resins.

2. Resin solution compositions for electronic materials as described in claim 1 wherein said siloxanediamines are represented by the following general formula (2)

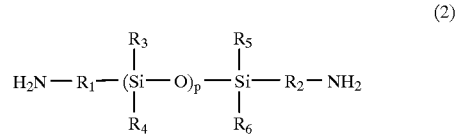

(in which $R_1$ and $R_2$ are divalent hydrocarbon groups, $R_3$ to $R_6$ are hydrocarbon groups with 1 to 6 carbon atoms, and p is an integer from 1 to 30) and the molar ratio of said siloxanediamines to aromatic diamines is 30/70 to 99/1.

3. Resin solution compositions for electronic materials as described in claim 2 wherein the average of repeating units (p) of the siloxanediamines represented by the general formula (2) is 1 to 12 and the molar ratio of said siloxanediamines to aromatic diamines is 50/50 to 99/1.

4. Resin solution compositions for electronic materials as described in any of claims 1 to 3 wherein the logarithmic viscosity of the siloxanepolyimidepolyamic acid copolymers is 0.08 to 1.2.

5. Protective membranes for circuits in printed wiring boards formed by resin solution compositions described in claim 2 wherein the average of repeating units (p) of the siloxanediamines represented by the general formula (2) is 1 to 12 and the molar ratio of said siloxanediamines to aromatic diamines is 70/30 to 99/1.

* * * * *